United States Patent
Rathnasinghe et al.

(10) Patent No.: US 12,230,482 B2
(45) Date of Patent: Feb. 18, 2025

(54) MOVEABLE EDGE RING DESIGNS

(71) Applicant: LAM RESEARCH CORPORATION, Fremont, CA (US)

(72) Inventors: Hiran Rajitha Rathnasinghe, Fremont, CA (US); Jon Mcchesney, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 676 days.

(21) Appl. No.: 16/497,091

(22) PCT Filed: Jul. 24, 2017

(86) PCT No.: PCT/US2017/043527
§ 371 (c)(1),
(2) Date: Sep. 24, 2019

(87) PCT Pub. No.: WO2019/022707
PCT Pub. Date: Jan. 31, 2019

(65) Prior Publication Data
US 2020/0020565 A1 Jan. 16, 2020

(51) Int. Cl.
*H01J 37/32* (2006.01)
*H01L 21/683* (2006.01)
*H01L 21/687* (2006.01)

(52) U.S. Cl.
CPC .. *H01J 37/32642* (2013.01); *H01J 37/32807* (2013.01); *H01L 21/6835* (2013.01);
(Continued)

(58) Field of Classification Search
CPC ............ C23C 16/4585; H01J 37/32642; H01J 37/32715; H01J 37/32807; H01L 21/6835;
(Continued)

(56) References Cited

U.S. PATENT DOCUMENTS 5,837,058 A * 11/1998 Chen ................... C23C 16/4581
118/500
6,231,716 B1 5/2001 White et al.
(Continued)

FOREIGN PATENT DOCUMENTS

EP 0821404 A2 1/1998
EP 0875979 A1 11/1998
(Continued)

OTHER PUBLICATIONS

International Search Report and Written Opinion issued in PCT/US2017/043527, mailed Apr. 20, 2018; ISA/KR.
(Continued)

*Primary Examiner* — Benjamin Kendall

(57) ABSTRACT

An edge ring is configured to be raised and lowered relative to a substrate support, via one or more lift pins, in a substrate processing system. The edge ring is further configured to interface with a guide feature extending upward from a bottom ring and/or a middle ring of the substrate support during tuning of the edge ring. The edge ring includes an upper surface, an annular inner diameter, an annular outer diameter, a lower surface, and an annular groove arranged in the lower surface of the edge ring to interface with the guide feature. Walls of the annular groove are substantially vertical.

26 Claims, 7 Drawing Sheets

(52) U.S. Cl.
CPC .. *H01L 21/68721* (2013.01); *H01L 21/68735* (2013.01); *H01L 21/68742* (2013.01); *H01L 2221/68304* (2013.01)

(58) Field of Classification Search
CPC ......... H01L 21/68721; H01L 21/68735; H01L 21/68742; H01L 2221/68304
See application file for complete search history.

(56) References Cited

U.S. PATENT DOCUMENTS

| | | | |
|---|---|---|---|
| 7,431,788 B2 | 10/2008 | Ricci et al. | |
| 9,412,555 B2 | 8/2016 | Augustino et al. | |
| 2002/0092602 A1* | 7/2002 | Saito ................. | H01L 21/68735 118/715 |
| 2003/0015141 A1 | 1/2003 | Takagi | |
| 2005/0061447 A1* | 3/2005 | Kim .................... | H01L 21/6831 156/345.51 |
| 2008/0236749 A1 | 10/2008 | Koshimizu et al. | |
| 2010/0108261 A1* | 5/2010 | Augustino ........ | H01J 37/32715 156/345.1 |
| 2013/0155568 A1 | 6/2013 | Todorow et al. | |
| 2013/0256962 A1 | 10/2013 | Ranish et al. | |
| 2014/0190822 A1 | 7/2014 | Riker et al. | |
| 2014/0235063 A1 | 8/2014 | McMillin et al. | |
| 2014/0311676 A1 | 10/2014 | Hatoh et al. | |
| 2015/0179412 A1* | 6/2015 | Chhatre ............ | H01J 37/32477 156/345.52 |
| 2016/0099162 A1* | 4/2016 | Ng .................... | H01J 37/32642 269/302 |
| 2016/0204019 A1 | 7/2016 | Ishii et al. | |
| 2016/0211166 A1 | 7/2016 | Yan et al. | |
| 2016/0307742 A1* | 10/2016 | Mishra .............. | H01L 21/68735 |
| 2017/0115657 A1 | 4/2017 | Trussell et al. | |
| 2017/0213758 A1* | 7/2017 | Rice .................... | H01L 21/6719 |
| 2017/0263478 A1 | 9/2017 | McChesney et al. | |

FOREIGN PATENT DOCUMENTS

| | | | |
|---|---|---|---|
| JP | 2002-231794 A | | 8/2002 |
| JP | 2004-266127 A | | 9/2004 |
| JP | 2004296553 A | * | 10/2004 |
| JP | 2008-251681 A | | 10/2008 |
| JP | 2016046451 A | | 4/2016 |
| JP | 2016-146472 A | | 8/2016 |
| JP | 2016-219820 A | | 12/2016 |
| KR | 2005-0038898 A | | 4/2005 |
| KR | 100578129 B1 | | 5/2006 |
| KR | 2013-0124616 A | | 11/2013 |
| KR | 2014-0101870 A | | 8/2014 |
| KR | 2014-0103872 A | | 8/2014 |
| KR | 10-2016-0063412 A | | 6/2016 |
| KR | 10-2016-0088820 A | | 7/2016 |
| KR | 2017-0037526 A | | 4/2017 |
| KR | 20180099776 A | | 9/2018 |
| TW | 201351532 A | | 12/2013 |
| TW | 201447965 A | | 12/2014 |
| WO | WO-2017131927 A1 | | 8/2017 |

OTHER PUBLICATIONS

International Search Report and Written Opinion issued in PCT/US2017/062769, mailed Aug. 21, 2018; ISA/KR.
Search Report dated Sep. 7, 2020 corresponding to European Application No. 17 919 402.2, 9 pages.
Machine Translation of Notice of Reasons for Refusal corresponding to Japanese Patent Application No. 2019-559033 dated Dec. 22, 2020, 4 pages.
Translation ofWritten Opinion corresponding to Singapore Application No. 11201907515W dated Mar. 15, 2020, 4 pages.
Translation of Notification of Examination Opinions dated May 4, 2020 corresponding to Taiwanese Patent Application No. 106142110, 7 pages.
Translation of Notification of Office Action dated Dec. 17, 2019 corresponding to Korean Patent Application No. 10-2018-7021511, 2 pages.
Translation of Notification of Office Action dated Jun. 26, 2020 corresponding to Korean Patent Application No. 10-2018-7021511, 2 pages.
Search Report dated Feb. 19, 2020 corresponding to European Application No. 17 932 862.0, 7 pages.
Office Action dated Dec. 1, 2020 corresponding to Japanese Application No. 2019-553416,4 pages.
Translation of Decision ofRefusal dated Feb. 3, 2021 corresponding to Taiwanese Patent Application No. 106142110, 4 pages.
Translation of Decision for Grant of Patent dated Jul. 28, 2020 corresponding to Korean Application No. 10-2018-7021879, 1 page.
Translation of Written Opinion corresponding to Singapore Application No. 11201908264Q dated Feb. 19, 2020, 7 pages.
Translation of Notification of Office Action dated Dec. 19, 2019 corresponding to Korean Patent Application No. 10-2018-7021879, 7 pages.
Translation of Notification of Office Action dated Mar. 29, 2020 corresponding to Korean Patent Application No. 10-2020-7004813, 3 pages.
Translation of Decision for Grant of Patent dated Feb. 24, 2021 corresponding to Korean Application No. 10-2020-7013289, 1 page.

* cited by examiner

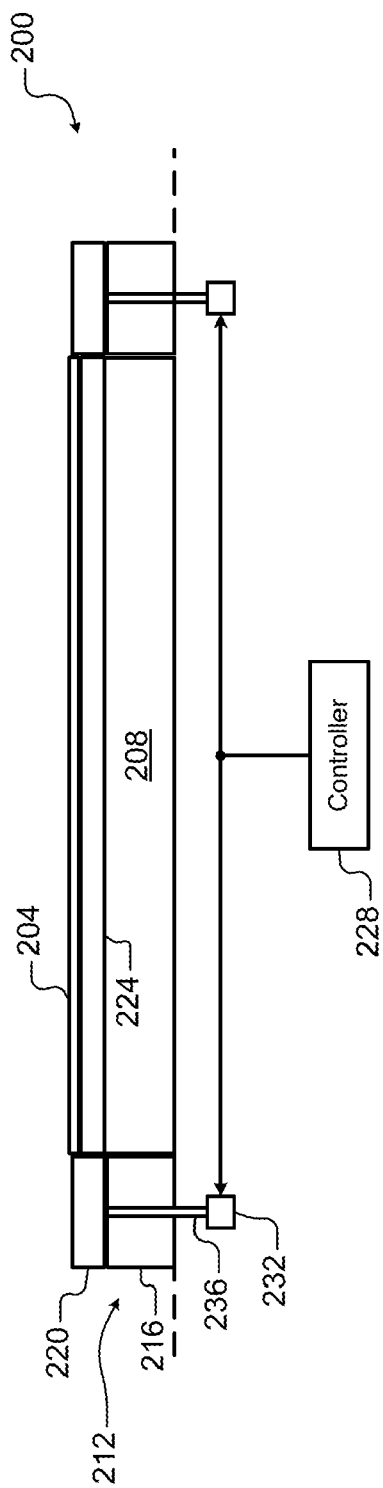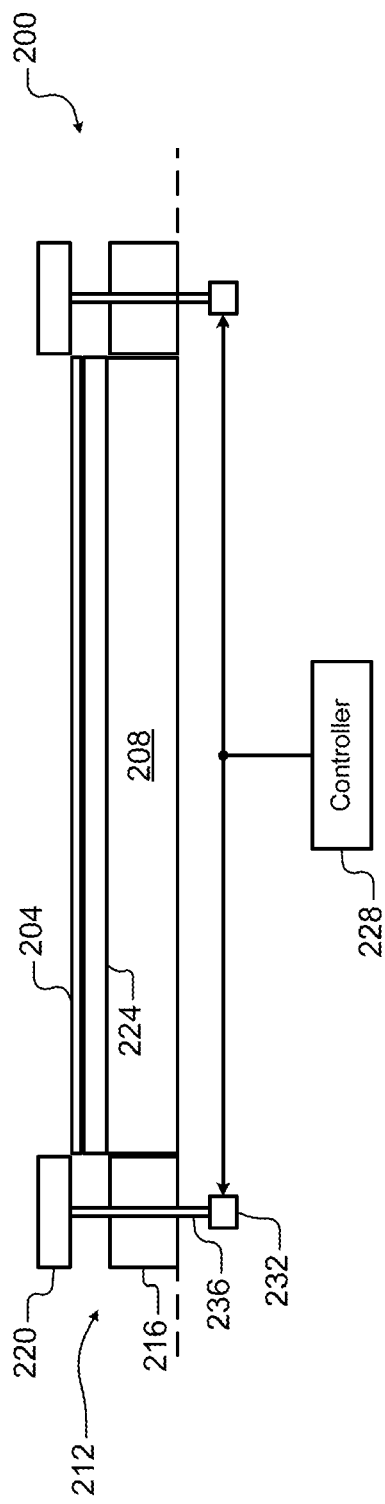

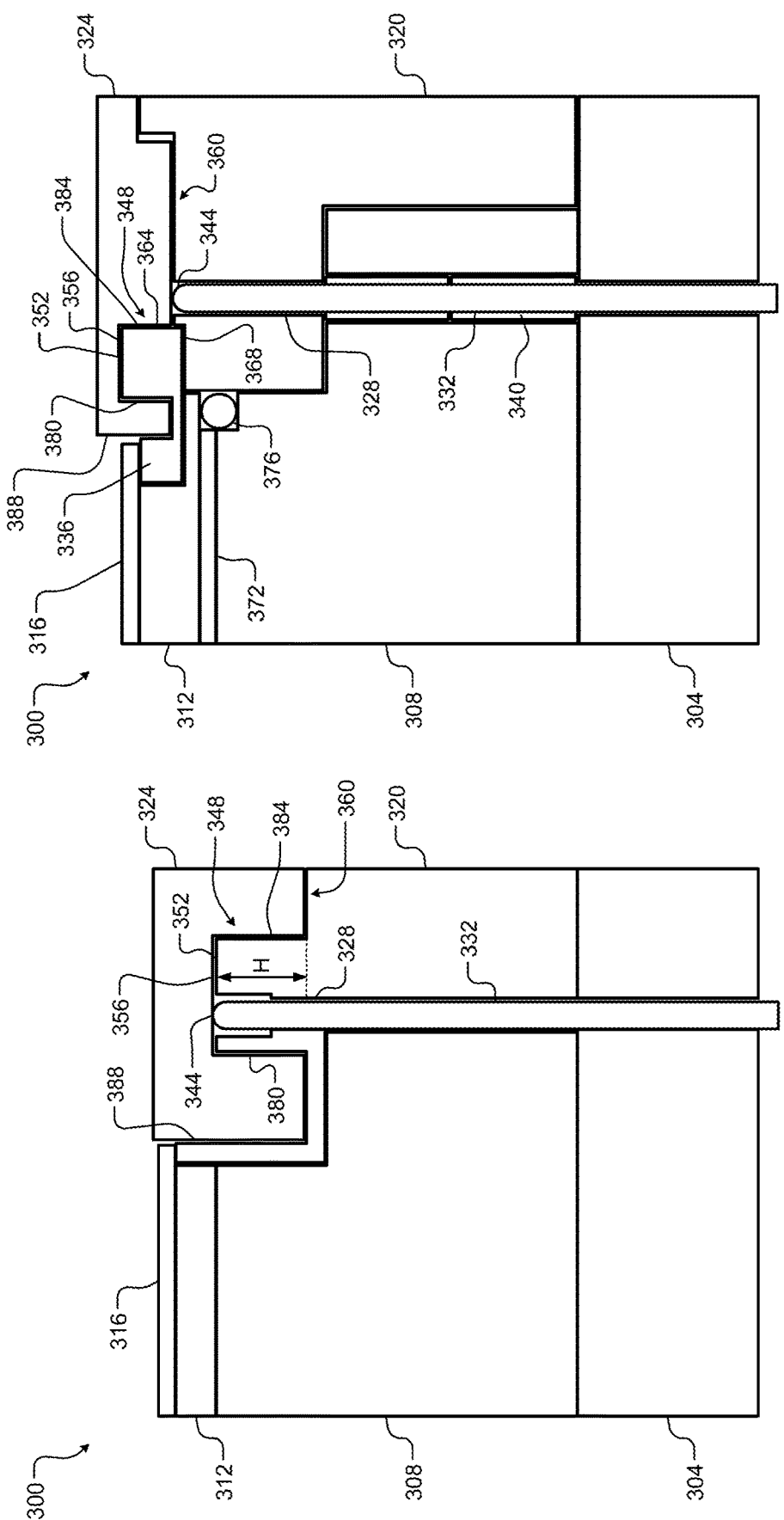

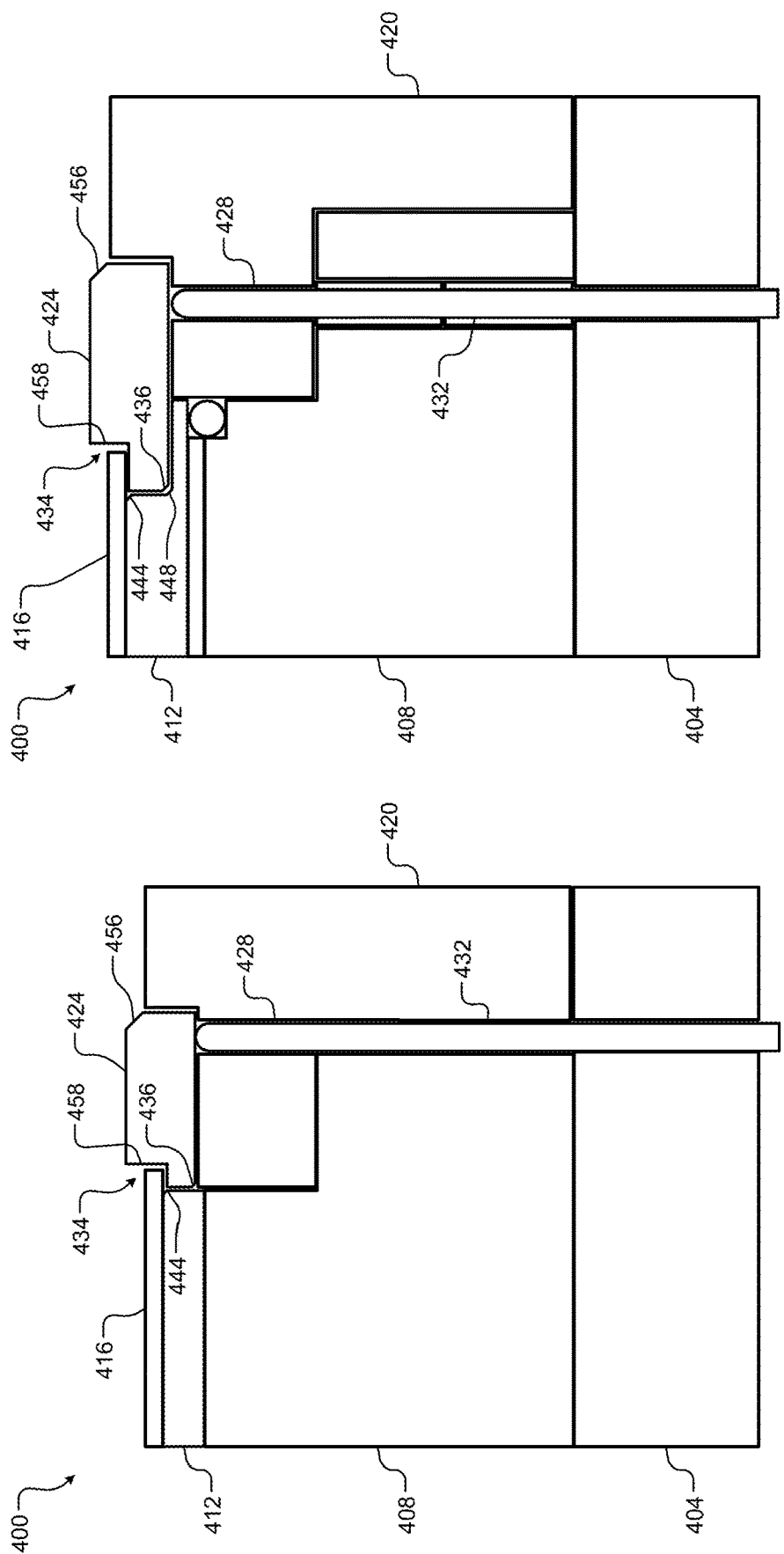

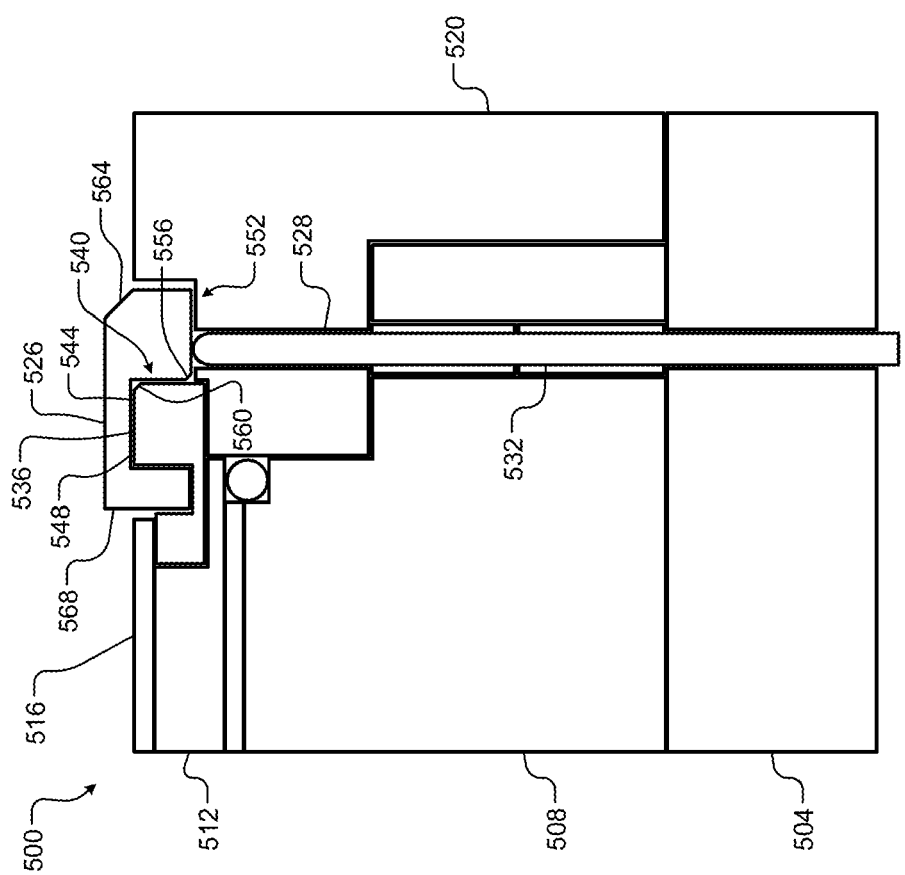
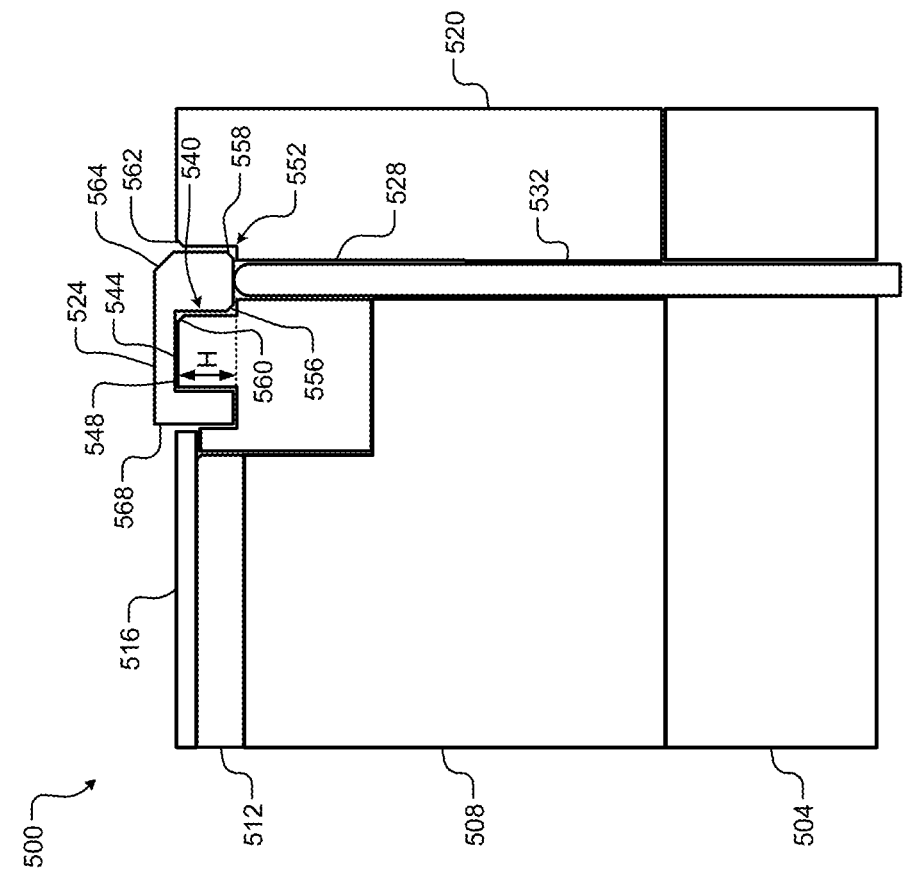
FIG. 5A
FIG. 5B

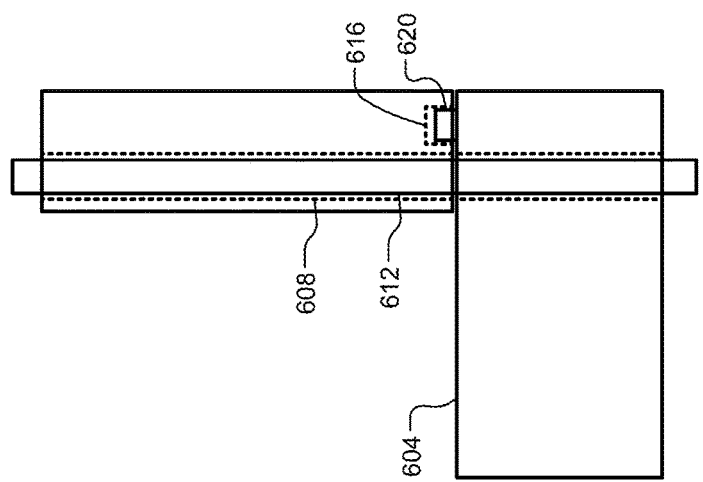
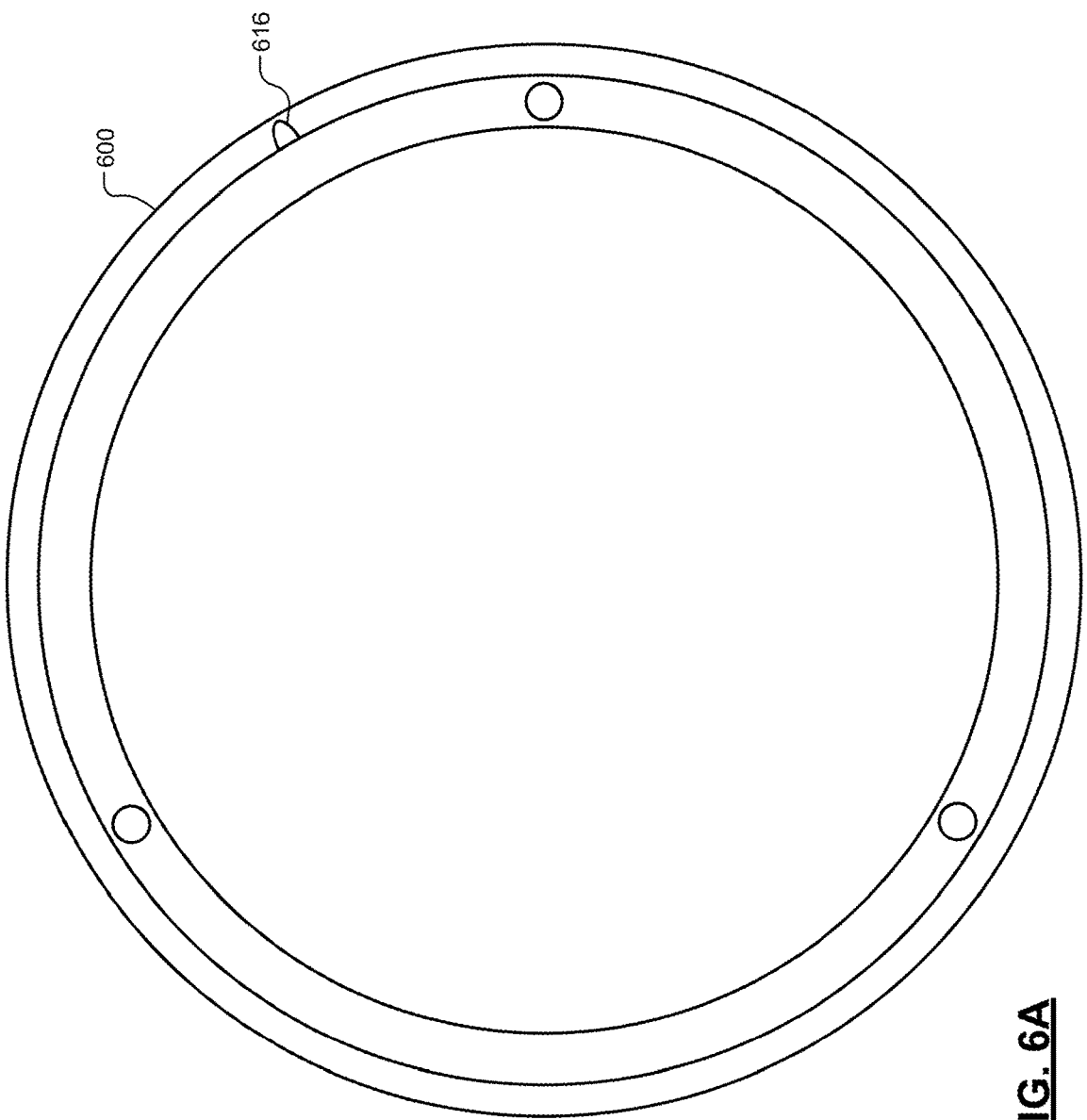

MOVEABLE EDGE RING DESIGNS

CROSS-REFERENCE TO RELATED APPLICATIONS

This application is a 371 U.S. National Phase of International Application No. PCT/US2017/043527, filed Jul. 24, 2017. The entire disclosure of the above application is incorporated herein by reference.

FIELD

The present disclosure relates to moveable edge rings in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc.

SUMMARY

An edge ring is configured to be raised and lowered relative to a substrate support, via one or more lift pins, in a substrate processing system. The edge ring is further configured to interface with a guide feature extending upward from a bottom ring and/or a middle ring of the substrate support during tuning of the edge ring. The edge ring includes an upper surface, an annular inner diameter, an annular outer diameter, a lower surface, and an annular groove arranged in the lower surface of the edge ring to interface with the guide feature. Walls of the annular groove are substantially vertical.

An edge ring is configured to be raised and lowered, via one or more lift pins, relative to a substrate support in a substrate processing system. The edge ring includes an upper surface, an annular inner diameter, an annular outer diameter, and a lower surface. An outer, upper corner of the edge ring at an interface between the upper surface and the outer diameter is chamfered.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A shows an example moveable edge ring in a lowered position according to the present disclosure;

FIG. 2B shows an example moveable edge ring in a raised position according to the present disclosure;

FIG. 3A shows a first example substrate support including a moveable edge ring according to the present disclosure;

FIG. 3B shows a second example substrate support including a moveable edge ring according to the present disclosure;

FIG. 4A shows a third example substrate support including a moveable edge ring according to the present disclosure;

FIG. 4B shows a fourth example substrate support including a moveable edge ring according to the present disclosure;

FIG. 5A shows a sixth example substrate support including a moveable edge ring according to the present disclosure;

FIG. 5B shows a seventh example substrate support including a moveable edge ring according to the present disclosure;

FIG. 6A shows a bottom view of an example bottom ring of a substrate support according to the present disclosure; and FIG. 6B shows a clocking feature of a bottom ring of a substrate support according to the present disclosure.

In the drawings, reference numbers may be reused to identify similar and/or identical elements.

DETAILED DESCRIPTION

A substrate support in a substrate processing system may include an edge ring. An upper surface of the edge ring may extend above an upper surface of the substrate support, causing the upper surface of the substrate support (and, in some examples, an upper surface of a substrate arranged on the substrate support) to be recessed relative to the edge ring. This recess may be referred to as a pocket. A distance between the upper surface of the edge ring and the upper surface of the substrate may be referred to as a "pocket depth." Generally, the pocket depth is fixed according to a height of the edge ring relative to the upper surface of the substrate.

Some aspects of etch processing may vary due to characteristics of the substrate processing system, the substrate, gas mixtures, etc. For example, flow patterns, and therefore an etch rate and etch uniformity, may vary according to the pocket depth of the edge ring, edge ring geometry (i.e., shape), as well as other variables including, but not limited to, gas flow rates, gas species, injection angle, injection position, etc. Accordingly, varying the configuration of the edge ring (e.g., including edge ring height and/or geometry) may modify the gas velocity profile across the surface of the substrate.

Some substrate processing systems may implement moveable (e.g., tunable) edge rings and/or replaceable edge rings. In one example, a height of a moveable edge may be adjusted during processing to control etch uniformity. The edge ring may be coupled to an actuator configured to raise and lower the edge ring in response to a controller, user interface, etc. In one example, a controller of the substrate processing system controls the height of the edge ring during a process, between process steps, etc. according to a particular recipe being performed and associated gas injection parameters. Further, edge rings and other components may comprise consumable materials that wear/erode over time. Accordingly, the height of the edge ring may be adjusted to compensate for erosion. In other examples, edge rings may be removable and replaceable (e.g., to replace eroded or damaged edge rings, to replace an edge ring with an edge ring having different geometry, etc.). Examples of substrate processing systems implementing moveable and replaceable edge rings can be found in U.S. patent application Ser. No. 14/705,430, filed on May 6, 2015, the entire contents of which are incorporated herein by reference.

Substrate processing systems and methods according to the principles of the present disclosure include moveable edge rings having various features that facilitate tuning and/or replacement.

Figure 1:
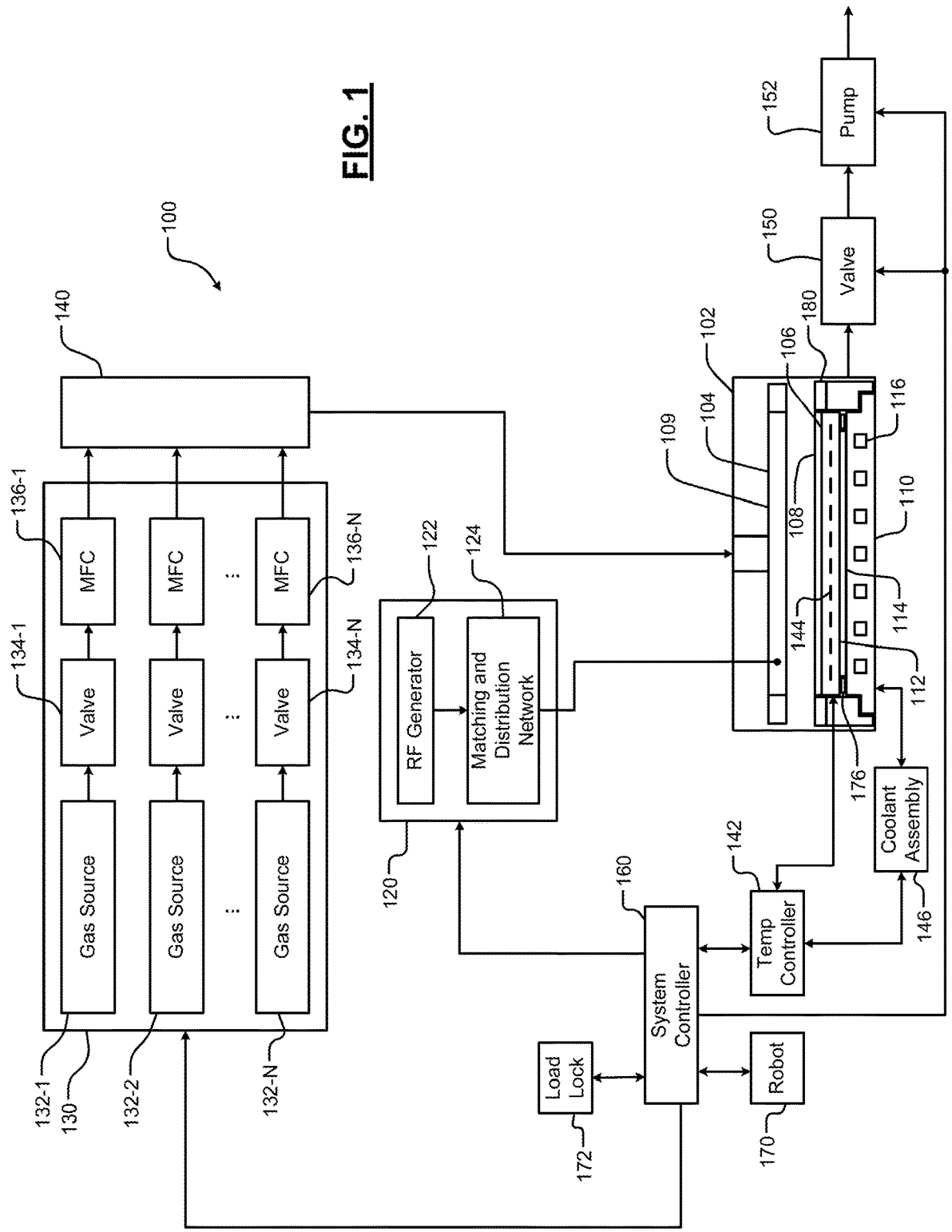
FIG. 1 is a functional block diagram of an example processing chamber according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Each of the heating elements 144 according to the principles of the present disclosure includes a first material having a positive TCR and a second material having a negative TCR as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes an edge ring 180. The edge ring 180 may correspond to a top ring, which may be supported by a bottom ring 184. In some examples, the edge ring 180 may be further supported by one or more of a middle ring (not shown in FIG. 1), a stepped portion of the ceramic layer 112, etc. as described below in more detail. The edge ring 180 according to the principles of the present disclosure is moveable (e.g., moveable upward and downward in a vertical direction) relative to the substrate 108. For example, the edge ring 180 may be controlled via an actuator responsive to the controller 176. In some examples, the edge ring 180 may be adjusted during substrate processing (i.e., the edge ring 180 may be a tunable edge ring). In other examples, the edge ring 180 may be removable (e.g., using the robot 170, via an airlock, while the processing chamber 102 is under vacuum). In still other examples, the edge ring 180 may be both tunable and removable.

Referring now to FIGS. 2A and 2B, an example substrate support 200 having a substrate 204 arranged thereon according to the principles of the present disclosure is shown. The substrate support 200 may include a base or pedestal having an inner portion (e.g., corresponding to an ESC) 208 and an outer portion 212. In examples, the outer portion 212 may be independent from, and moveable in relation to, the inner portion 208. For example, the outer portion 212 may include a bottom ring 216 and a top edge ring 220. The substrate 204 is arranged on the inner portion 208 (e.g., on a ceramic layer 224) for processing. A controller 228 communicates with one or more actuators 232 to selectively raise and lower the edge ring 220. For example, the edge ring 220 may be raised and/or lowered to adjust a pocket depth of the support 200 during processing. In another example, the edge ring 220 may be raised to facilitate removal and replacement of the edge ring 220.

For example only, the edge ring 220 is shown in a fully lowered position in FIG. 2A and in an example fully raised position in FIG. 2B. As shown, the actuators 232 correspond to pin actuators configured to selectively extend and retract pins 236 in a vertical direction. Other suitable types of actuators may be used in other examples. For example only, the edge ring 220 corresponds to a ceramic or quartz edge ring, although other suitable materials may be used (e.g., silicon carbide, yttria, etc.). In FIG. 2A, the controller 228 communicates with the actuators 232 to directly raise and lower the edge ring 220 via the pins 236. In some examples, the inner portion 208 is moveable relative to the outer portion 212.

Features of an example substrate support 300 according to the principles of the present disclosure are shown in more detail in FIGS. 3A and 3B. The substrate support 300 includes an insulator ring or plate 304 and a baseplate (e.g., of an ESC) 308 arranged on the insulator plate 304. The baseplate 308 supports a ceramic layer 312 configured to support a substrate 316 arranged thereon for processing. In FIG. 3A, the ceramic layer 312 has a non-stepped configuration. In FIG. 3B, the ceramic layer 312 has a stepped configuration. The substrate support 300 includes a bottom ring 320 that supports an upper ("top") edge ring 324. One or more vias or guide channels 328 may be formed through the insulator plate 304, the bottom ring 320, and/or the baseplate 308 to accommodate respective lift pins 332 arranged to selectively raise and lower the edge ring 324. For example, the guide channels 328 function as pin alignment holes for respective ones of the lift pins 332. As shown in FIG. 3B, the substrate support 300 may further include a middle ring 336 arranged between the bottom ring 320 and the edge ring 324. In the stepped configuration, the middle ring 336 overlaps the ceramic layer 312 and is arranged to support an outer edge of the substrate 316.

The lift pins 332 may comprise an erosion-resistant material (e.g., sapphire). An outer surface of the lift pins 332 may be polished smooth to reduce friction between the lift pins 332 and structural features of the bottom ring 320. to facilitate movement. In some examples, one or more ceramic sleeves 340 may be arranged in the channels 328 around the lift pins 332. Each of the lift pins 332 may include a rounded upper end 344 to minimize contact area between the upper end 344 and the edge ring 324. The smooth outer surface, rounded upper end 344, guide channel 328, and/or ceramic sleeves 340 facilitate raising and lowering of the edge ring 324 and while preventing binding of the lift pins 332 during movement.

As shown in FIG. 3A, the bottom ring 320 includes a guide feature 348. In FIG. 3B, the middle ring 336 includes the guide feature 348. For example, the guide feature 348 corresponds to a raised annular rim 352 that extends upward from the bottom ring 320/the middle ring 336. In FIG. 3A, the guide channels 328 and the lift pins 332 extend through the guide feature 348 to engage the edge ring 324. Conversely, in FIG. 3B, the guide channels 328 and the lift pins 332 extend through the bottom ring 320 to engage the edge ring 324 without passing through the middle ring 336.

The edge ring 324 includes an annular bottom groove 356 arranged to receive the guide feature 348. For example, a profile (i.e., cross-section) shape of the edge ring 324 may generally correspond to a "U" shape configured to receive the guide feature 348, although other suitable shapes may be used. Further, although the upper surface of the edge ring 324 is shown as generally horizontal (i.e., parallel to an upper surface of the substrate support 300), the upper surface of the edge ring 324 may have a different profile in other examples. For example, the upper surface of the edge ring 324 may be tilted or slanted, rounded, etc. In some examples, the upper surface of the edge ring 324 is tilted such that a thickness at an inner diameter of the edge ring 324 is greater than a thickness at an outer diameter of the edge ring 324 to compensate for erosion at the inner diameter.

Accordingly, a bottom surface of the edge ring 324 is configured to be complementary to an upper surface of the bottom ring 320 in FIG. 3A, or respective surfaces of the bottom ring 320 and the middle ring 336 in FIG. 3B. Further, an interface 360 between the edge ring 324 and the bottom ring 320/middle ring 336 is labyrinthine. In other words, the lower surface of the edge ring 324 and, correspondingly, the interface 360, includes multiple changes of direction (e.g., 90 degree changes of direction, upward and downward steps, alternating horizontal and vertical orthogonal paths, etc.) rather than providing a direct path between the edge ring 324 and the bottom ring 320/middle ring 336 to interior structures of the substrate support 300. Typically, likelihood of plasma and process material leakage may be increased in substrate supports including multiple interfacing rings (e.g., both the top edge ring 324 and one or more of the middle ring 336 and the bottom ring 320). This likelihood may be further increased when the moveable edge ring 324 is raised during processing. Accordingly, the interface 360 (and, in particular, the profile of the edge ring 324) is configured to prevent process materials, plasma, etc. from reaching interior structures of the substrate support 300.

For example, as shown in FIG. 3A, the interface 360 includes five changes of direction to restrict access to the guide channels 328 and pins 332, the ceramic layer 312, a backside and edge of the substrate 316, etc. Conversely, as shown in FIG. 3B, the interface 360 includes seven changes of direction in a first path 364 and five changes of direction in a second path 368 to restrict access to the guide channels 328 and pins 332, the ceramic layer 312, a backside and edge of the substrate 316, a bond layer 372, a seal 376, etc. Accordingly, the interface 360 reduces the likelihood of plasma leakage and light-up, erosion, etc. affecting the interior structures of the substrate support 300.

The profile (i.e., cross-section) shape of the edge ring 324 (as well as the interfacing surfaces of the bottom ring 320, middle ring 336, etc.) is designed to facilitate manufacturing and reduce manufacturing costs. For example, walls 380, 384 of the groove 356 and the guide feature 348 may be substantially vertical (e.g., in contrast to being parabolic, trapezoidal, triangular, etc.) to facilitate manufacturing while preventing plasma and process material leakage. For example only, substantially vertical may be defined as being perpendicular to upper and/or lower surfaces of the edge ring 324, within 1° of a normal line of an upper and/or lower surface of the edge ring 324, parallel to a direction of movement of the edge ring 324, etc. Further, the vertical walls 380, 384 maintain alignment of the edge ring 324 relative to the guide feature 348 during movement of the edge ring 324. In contrast, when respective profiles of the groove 356 and the guide feature 348 are parabolic, trapezoidal, triangular, etc., upward movement of the edge ring 324 causes significant separation between the walls 380 and the walls 384.

Surfaces of the edge ring 324, the bottom ring 320, and the middle ring 336 within the interface 360 (and, in particular, within the groove 356) are relatively smooth and continuous to minimize friction between the edge ring 324 and the guide feature 348 during movement of the edge ring 324. For example, respective surfaces of the edge ring 324, the bottom ring 320, and the middle ring 336 within the interface 360 may undergo additional polishing to achieve a desired surface smoothness. In other examples, surfaces of the edge ring 324, the bottom ring 320, and the middle ring 336 within the interface 360 may be coated with a material that further reduces friction. In still other examples, the surfaces of the edge ring 324, the bottom ring 320, and the middle ring 336 within the interface 360 (and, in particular, the edge ring 324) may be free of screw holes and/or similar assembly features. In this manner, creation of particles due to contact between surfaces (e.g., during movement of the edge ring 324) may be minimized.

When the edge ring 324 is raised for tuning during processing as described above, the controller 228 as described in FIGS. 2A and 2B is configured to limit a tunable range of the edge ring 324 according to a height H of the guide feature 348. For example, the tunable range may be limited to less than the height H of the guide feature 348. For example, if the guide feature 348 has a height H of approximately 8 mm (e.g., 7.7-8.3 mm), the tunable range of the edge ring 324 may be 6 mm. In other words, the edge ring 324 may be raised from a fully lowered position (e.g., 0 mm) to a fully raised position (e.g., 6 mm) without entirely removing the guide feature 348 from the groove 356 in the edge ring 324. Accordingly, even in the fully raised position, the edge ring 324 still overlaps at least a portion of the guide feature 348. Limiting the range of the edge ring 324 in this manner retains the labyrinthine interface 360 as described above and prevents lateral misalignment of the edge ring 324. A depth of the groove 356 may be approximately equal to (e.g., within 5%) of the height H of the guide feature 348. The depth of the groove 356 may be at least 50% of the thickness of the edge ring. For example only, the tunable range of the edge ring 324 of FIG. 3A is 6 mm and the tunable range of the edge ring 324 of FIG. 3B is 1 mm. For example, an overall thickness (i.e., height) of the edge ring 324 may be between approximately 0.459" (e.g., 0.450" to 0.469") and approximately 0.592" (e.g., 0.582" to 0.602""), and a depth of the groove 356 may be approximately 0.308" (e.g., 0.298" to 0.318").

For example, the overall thickness of the edge ring 324 may correspond to a thickness of the edge ring 324 at an inner diameter of the edge ring 324 (e.g., a thickness/height of the edge ring 324 at an inner wall 388). In some examples, a thickness of the edge ring 324 may not be uniform across an upper surface of the edge ring 324 (e.g., the upper surface of the edge ring 324 may be tilted as described above such that a thickness at the inner wall 388 is greater than a thickness at an outer diameter of the edge ring 324). However, since erosion due to exposure to plasma may be increased at the inner wall 388 relative to an outer diameter of the edge ring 324, the edge ring 324 may be formed such that the inner wall 388 has at least a predetermined thickness to compensate for the increased erosion at the inner wall 388. For example only, the inner wall 388 is substantially vertical to avoid contact with the substrate 316 during movement of the edge ring 324.

Figure 4C:
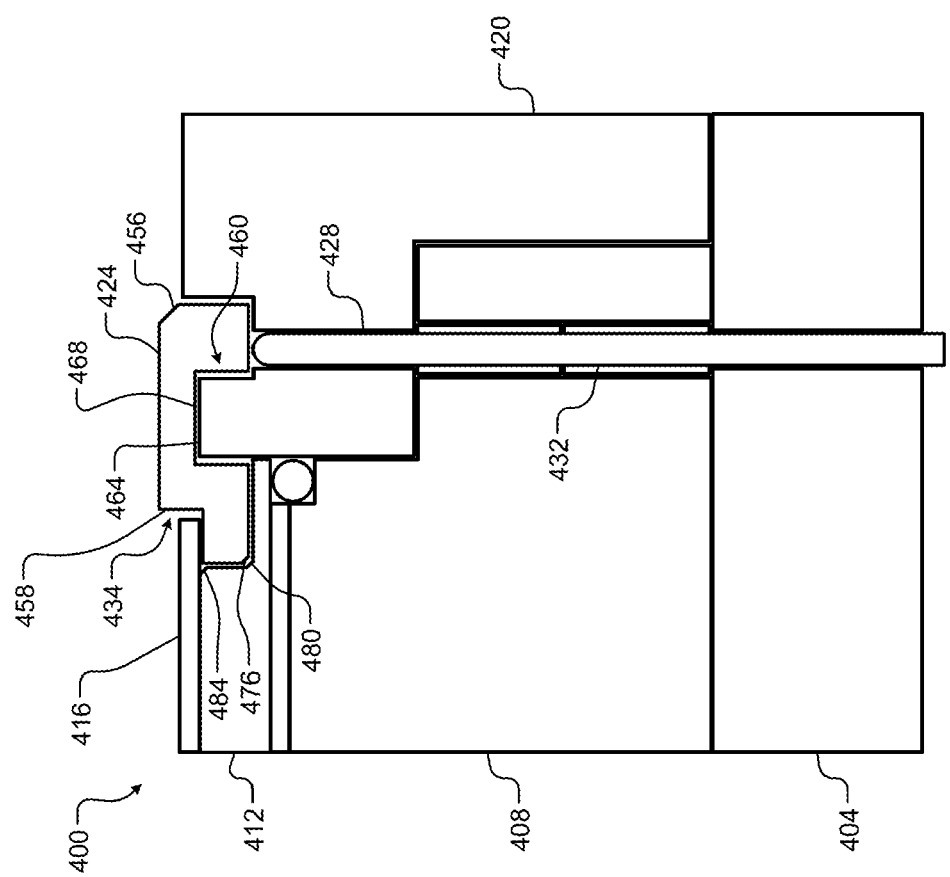
FIG. 4C shows a fifth example substrate support including a moveable edge ring according to the present disclosure.

Referring now to FIGS. 4A, 4B, and 4C, another example substrate support 400 according to the principles of the present disclosure is shown in more detail. The substrate support 400 includes an insulator ring or plate 404 and a baseplate 408 arranged on the insulator plate 404. The baseplate 408 supports a ceramic layer 412 configured to support a substrate 416 arranged thereon for processing. In FIG. 4A, the ceramic layer 412 has a non-stepped configuration. In FIGS. 4B and 4C, the ceramic layer 412 has a stepped configuration. The substrate support 400 includes a bottom ring 420 that supports an upper edge ring 424. In the stepped configuration, the edge ring 424 overlaps the ceramic layer 412. One or more vias or guide channels 428 may be formed through the insulator plate 404, the bottom ring 420, and/or the baseplate 408 to accommodate respective lift pins 432 arranged to selectively raise and lower the edge ring 424. For example, the guide channels 428 function as pin alignment holes for respective ones of the lift pins 432.

In the examples of FIGS. 4A, 4B, and 4C, the edge rings 424 are configured to support an outer edge of the substrate 416 arranged on the ceramic layer 412. For example, inner diameters of the edge rings 424 include a step 434 arranged to support the outer edge of the substrate 416. Accordingly, the edge ring 424 may be raised and lowered to facilitate removal and replacement of the edge ring 424 buy may not be raised and lowered during processing (i.e., the edge ring 424 is not tunable). For example, the edge ring 424 may be raised using the lift pins 432 for removal and replacement (e.g., using the robot 170).

In an example, a lower, inside corner 436 of the edge ring 424 may be chamfered to facilitate alignment (i.e., centering) of the edge ring 424 on the substrate support 400. Conversely, an upper, outside corner 444 and/or a lower, inside corner 448 of the ceramic layer 412 may be chamfered complementarily to the corner 436. Accordingly, as the edge ring 424 is lowered onto the substrate support 400, the chamfered corner 436 interacts with the chamfered corner(s) 444/448 to cause the edge ring 424 to self-center on the substrate support 400.

An upper, outer corner 456 of the edge ring 424 may be chamfered to facilitate removal of the edge ring 424 from the processing chamber 102. For example, since the substrate support 400 is configured for in situ removal of the edge ring 424 (i.e., without fully opening and venting the processing chamber 102), the edge ring 424 is configured to be removed via an airlock. Typically, airlocks are sized to accommodate substrates of a predetermined size (e.g., 300 mm). However, the edge ring 424 has a diameter that is significantly larger than the substrate 416 and a typical edge ring 424 may not fit through the airlock. Accordingly, a diameter of the edge ring 424 is reduced (e.g., as compared to the edge rings 324 as shown in FIGS. 3A and 3B). For example, an outer diameter of the edge ring 324 is similar to an outer diameter of the bottom ring 320. Conversely, an outer diameter of the edge ring 424 is significantly less than an outer diameter of the bottom ring 420. For example only, an outer diameter of the edge ring 424 is less than or equal to approximately 12.833" (e.g., 12.823" to 12.843"). An inner diameter of the edge ring 424 is greater than approximately 11.6" (e.g., greater than 11.5"). Chamfering the outer corner 356 further facilitates transfer of the edge ring 424 through the airlock.

For example only, the chamfer of the outer corner may have a height of approximately 0.060" (e.g., 0.050" to 0.070"), a width of approximately 0.040" (e.g., 0.030" to 0.050"), and an angle of approximately 30° (e.g., 25-35°). In some examples, other outer corners of the edge ring 424 may be chamfered in addition to or instead of the outer corner 356. In some examples, the chamfer of the lower corner 436 may have a height of approximately 0.025" (e.g., 0.015" to 0.040"), a width of approximately 0.015" (e.g., 0.005" to 0.030"), and an angle of approximately 60° (50-70°). For example only, an overall thickness (i.e., height) of the edge ring 424 is approximately, but not greater than, 0.268" (e.g., 0.258" to 0.268"). For example, the thickness of the edge ring 424 may not exceed a height of an airlock of the processing chamber 102 to allow removal of the edge ring 424. For example only, the overall thickness of the edge ring 424 may correspond to a thickness of the edge ring 424 at an inner diameter of the edge ring 424 (e.g., a thickness/height of the edge ring 424 at an inner wall 458) as described above with respect to FIGS. 3A and 3B.

As shown in FIG. 4C, the bottom ring 420 includes a guide feature 460. For example, the guide feature 460 corresponds to a raised annular rim 464 that extends upward from the bottom ring 420. The guide channels 428 and the lift pins 432 extend through the bottom ring 420 to engage the edge ring 424. The edge ring 424 includes an annular bottom groove 468 arranged to receive the guide feature 460. For example, a profile of the edge ring 424 may generally correspond to a "U" shape configured to receive the guide feature 460.

Accordingly, similar to the examples of FIGS. 3A and 3B, a bottom surface of the edge ring 424 is configured to be complementary to respective upper surfaces of the bottom ring 420 and the ceramic layer 412 to form a labyrinthine interface 472. In other words, the interface 472 includes multiple changes of direction (e.g., 90 degree changes of direction) rather than providing a direct path between the edge ring 424 and the bottom ring 420 to interior structures of the substrate support 400. In some examples, portions of the guide feature 460, the edge ring 424, the bottom ring 420, and/or the ceramic layer 412 within the interface 360 may be chamfered to facilitate alignment (i.e., centering) of the edge ring 424 on the substrate support 400. For example, a lower, inside corner 476 of an inner diameter of the edge ring 424 and a corresponding lower, inside corner 480 and/or upper, outside corner 484 of the ceramic layer 412 are chamfered. In other examples, mechanical alignment of the guide feature 460 within the groove 468 centers the edge ring 324. In some examples, the chamfer of the lower corner 476 may have a height of approximately 0.025" (e.g., 0.015" to 0.040"), a width of approximately 0.015" (e.g., 0.005" to 0.030"), and an angle of approximately 60° (e.g., 50-60°).

Referring now to FIGS. 5A and 5B, another example substrate support 500 according to the principles of the present disclosure is shown in more detail. The substrate support 500 includes an insulator ring or plate 504 and a baseplate 508 arranged on the insulator plate 504. The baseplate 508 supports a ceramic layer 512 configured to support a substrate 516 arranged thereon for processing. In FIG. 5A, the ceramic layer 512 has a non-stepped configuration. In FIG. 5B, the ceramic layer 512 has a stepped configuration. The substrate support 500 includes a bottom ring 520 that supports an upper edge ring 524 (as shown in FIG. 5A) or an upper edge ring 526 (as shown in FIG. 5B). One or more vias or guide channels 528 may be formed through the insulator plate 504, the bottom ring 520, and/or the baseplate 508 to accommodate respective lift pins 532 arranged to selectively raise and lower the edge ring 524/526. For example, the guide channels 528 function as pin alignment holes for respective ones of the lift pins 532. As shown in FIG. 5B, the substrate support 500 may further include a middle ring 536 arranged between the bottom ring 520 and the edge ring 524/526. In the stepped configuration, the middle ring 536 overlaps the ceramic layer 512 and is arranged to support an outer edge of the substrate 516.

The examples of FIGS. 5A and 5B combine features of both the tunable edge rings 324 of FIGS. 3A and 3B and the removable/replaceable edge rings of FIGS. 4A, 4B, and 4C. For example, even in the stepped configuration of FIG. 5B, the edge ring 526 does not extend beneath and support the substrate 516. Accordingly, the edge ring 524/526 may be raised and lowered during processing. For example only, a tunable range of the edge ring 524 of FIG. 5A is 2.75 mm and a tunable range of the edge ring 526 of FIG. 5B is 1 mm. Further, an outer diameter of the edge ring 524/526 is reduced as described with respect to FIGS. 4A, 4B, and 4C to facilitate transfer of the edge ring 524/526 through an airlock. Accordingly, the edge ring 524/526 may be removed and replaced in situ as described above.

As shown in FIG. 5A, the bottom ring 520 includes a guide feature 540. In FIG. 5B, the middle ring 536 includes the guide feature 540. For example, the guide feature 540 corresponds to a raised annular rim 544 that extends upward from the bottom ring 520/the middle ring 536. In each of FIGS. 5A and 5B, the guide channels 528 and the lift pins 532 extend through the bottom ring 520 to engage the edge ring 524/526. For example, the edge ring 524/526 includes an annular bottom groove 548 arranged to receive the guide feature 540. For example, a profile of the edge ring 524/526 may generally correspond to a "U" shape configured to receive the guide feature 540.

Accordingly, similar to the examples of FIGS. 3A, 3B, and 4C, a bottom surface of the edge ring 524/526 is configured to be complementary to respective upper surfaces of the bottom ring 520 and the middle ring 536 to form a labyrinthine interface 552. In other words, the interface 552 includes multiple changes of direction (e.g., 90 degree changes of direction) rather than providing a direct path between the edge ring 524/526 and the bottom ring 520 to interior structures of the substrate support 500. In some examples, portions of the guide feature 540, the edge ring 524/526, the bottom ring 520, and/or the middle ring 536 within the interface 552 may be chamfered to facilitate alignment (i.e., centering) of the edge ring 524/526 on the substrate support 500. For example, in FIG. 5A, corners 556 and 558 of the edge ring 524 and complementary corners 560 of the guide feature 540 and 562 of the bottom ring 520 are chamfered. Conversely, in FIG. 5B, only the corner 556 of the edge ring 526 and the corner 560 of the bottom ring 520 are chamfered. An upper, outer corner 564 of the edge ring 524 may be chamfered to facilitate removal of the edge ring 524 from the processing chamber 102 as described above with respect to FIGS. 4A, 4B, and 4C.

For example only, the chamfers of the lower corners 556 and 558 may have a height and width of approximately 0.015" (e.g., 0.005" to 0.030") and an angle of approximately 30° (e.g., 25 to 35°). For example, an overall thickness (i.e., height) of the edge ring 524/526 may be approximately, but not greater than, 0.268" (e.g., greater than 0.258") and a depth of the groove 548 may be approximately 0.210" (e.g., 0.200 to 0.220"). A difference between the thickness of the edge ring 524/526 and the depth of the groove 548 may be not less than 0.058". For example, the thickness of the edge ring 524/526 may not exceed a height of an airlock of the processing chamber 102 to allow removal of the edge ring 524/526. However, the thickness of the edge ring 524/526 may also be maximized, without exceeding the height of the airlock, to optimize tunability of the edge ring 524/526. In other words, as the edge ring 524/526 erodes over time, the amount the edge ring 524/526 may be raised without needing to be replaced increases proportionately to the thickness of the edge ring 524/526. For example only, the overall thickness of the edge ring 524/526 may correspond to a thickness of the edge ring 524/526 at an inner diameter of the edge ring 524/526 (e.g., a thickness/height of the edge ring 524/526 at an inner wall 568) as described above with respect to FIGS. 3A, 3B, 4A, 4B, and 4C.

Referring now to FIGS. 6A and 6B, an example bottom ring 600 (e.g., corresponding to any of the bottom rings 320, 420, or 520) may implement a clocking feature to facilitate alignment of the bottom ring 600 with an insulator ring 604. The bottom ring 600 includes a plurality of guide channels 608 arranged to receive respective lift pins 612 extending through the insulator ring 604. The bottom ring 600 further includes one or more clocking features, such as a notch 616. The notch 616 is configured to receive a complementary structure, such as a projection 620, extending upward from the insulator ring 604. Accordingly, the bottom ring 600 may be installed such that the notch 616 is aligned with and receives the projection 620 to ensure that the guide channels 608 are aligned with respective ones of the lift pins 612.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An edge ring configured to be raised and lowered relative to a substrate support, via one or more lift pins, in a substrate processing system, wherein the edge ring is further configured to interface with a guide feature extending upward from a bottom ring and/or a middle ring of the substrate support during tuning of the edge ring, the edge ring comprising:
   an upper surface;
   an annular inner diameter;
   an annular outer diameter;
   a lower surface; and
   an annular groove arranged in the lower surface of the edge ring to interface with the guide feature, wherein walls of the annular groove are substantially vertical,
   wherein a depth of the annular groove is at least 50% of a thickness of the edge ring,
   wherein the depth of the annular groove is selected according to a tunable range of the edge ring, and
   wherein the annular inner diameter of the edge ring defines a substantially vertical inner wall having a height that is substantially the same as a maximum height of the edge ring.

2. The edge ring of claim 1, wherein the edge ring is "U"-shaped.

3. The edge ring of claim 1, wherein the depth of the annular groove is between 7.7 mm and 8.3 mm.

4. The edge ring of claim 1, wherein a first corner on the lower surface of the edge ring is chamfered.

5. The edge ring of claim 1, wherein a first corner within the annular groove is chamfered.

6. The edge ring of claim 1, wherein an upper corner of an outer diameter of the edge ring is chamfered.

7. The edge ring of claim 1, wherein the lower surface of the edge ring includes at least four changes in direction.

8. The edge ring of claim 1, wherein the lower surface of the edge ring includes at least five alternating vertical and horizontal paths.

9. The edge ring of claim 1, wherein an outer diameter of the edge ring is less than approximately 12.883" and the annular inner diameter of the edge ring is greater than approximately 11.6".

10. The edge ring of claim 1, wherein the thickness of the edge ring at the annular inner diameter is between approximately 0.459" and approximately 0.592".

11. An edge ring configured to be raised and lowered, via one or more lift pins, relative to a substrate support in a substrate processing system, the edge ring comprising:
    an upper surface;
    an annular inner diameter;
    an annular outer diameter sized to allow removal of the edge ring through an airlock of the substrate processing system; and
    a lower surface,
    wherein an outer upper corner of the edge ring at an interface between the upper surface and the annular outer diameter is chamfered to facilitate removal of the edge ring through the airlock.

12. The edge ring of claim 11, wherein the chamfered outer upper corner has a height of approximately 0.060", a width of approximately 0.040", and an angle of approximately 30°.

13. The edge ring of claim 11, wherein an inner lower corner of the edge ring at an interface between the lower surface and the annular inner diameter is chamfered.

14. The edge ring of claim 13, wherein the chamfered inner lower corner has a height of approximately 0.015", a width of approximately 0.015", and an angle of approximately 30°.

15. The edge ring of claim 13, wherein the chamfered inner lower corner has a height of approximately 0.025", a width of approximately 0.015", and an angle of approximately 60°.

16. The edge ring of claim 11, wherein the annular outer diameter of the edge ring is less than approximately 12.883" and the annular inner diameter of the edge ring is greater than approximately 11.6".

17. The edge ring of claim 11, further comprising an annular groove arranged in the lower surface of the edge ring, wherein walls of the annular groove are substantially vertical.

18. The edge ring of claim 17, wherein the edge ring is "U"-shaped.

19. The edge ring of claim 17, wherein a depth of the annular groove is at least 50% of a thickness of the edge ring.

20. The edge ring of claim 17, wherein a depth of the annular groove is selected according to a tunable range of the edge ring.

21. The edge ring of claim 17, wherein a depth of the annular groove is between 7.7 mm and 8.3 mm.

22. The edge ring of claim 17, wherein a corner on the lower surface of the edge ring adjacent to the annular groove is chamfered.

23. The edge ring of claim 17, wherein a lower corner of the edge ring at an interface between the lower surface and the annular outer diameter is chamfered.

24. The edge ring of claim 17, wherein the lower surface of the edge ring includes at least four changes in direction.

25. The edge ring of claim 17, wherein the annular inner diameter of the edge ring includes a step.

26. The edge ring of claim 11, wherein a thickness of the edge ring at the annular inner diameter is approximately 0.268".

* * * * *